(12) United States Patent
Shen et al.

(10) Patent No.: US 11,508,857 B2
(45) Date of Patent: Nov. 22, 2022

(54) OPTICAL SCRAMBLER WITH NANO-PYRAMIDS

(71) Applicant: University of Florida Research Foundation, Incorporated, Gainesville, FL (US)

(72) Inventors: Haoting Shen, Tallahassee, FL (US); Navid Asadizanjani, Gainesville, FL (US); Domenic J. Forte, Gainesville, FL (US); Mark M. Tehranipoor, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 0 days.

(21) Appl. No.: 16/775,178

(22) Filed: Jan. 28, 2020

(65) Prior Publication Data

US 2020/0251602 A1    Aug. 6, 2020

Related U.S. Application Data

(60) Provisional application No. 62/800,714, filed on Feb. 4, 2019.

(51) Int. Cl.
*H01L 21/00* (2006.01)
*H01L 31/0236* (2006.01)
(Continued)

(52) U.S. Cl.
CPC .. *H01L 31/02363* (2013.01); *H01L 21/76807* (2013.01); *H01L 23/53238* (2013.01);
(Continued)

(58) Field of Classification Search
None
See application file for complete search history.

(56) References Cited

U.S. PATENT DOCUMENTS

| | | | |
|---|---|---|---|
| 9,263,326 B2 * | 2/2016 | Kanki | H01L 21/02074 |
| 2002/0055256 A1 * | 5/2002 | Jiang | H01L 21/76807 |
| | | | 438/687 |
| 2003/0022472 A1 * | 1/2003 | Goh | H01L 21/76829 |
| | | | 438/528 |

OTHER PUBLICATIONS

Mavrokefalos, Anastassios et al. *Efficient Light Trapping in Inverted Nanopyramid Thin Crystalline Silicon Membranes for Solar Cell Applications,* Nano Letters, vol. 12, No. 6, (2012), pp. 2792-2796. DOI: 10.1021/nl2045777.
(Continued)

*Primary Examiner* — Hung K Vu
(74) *Attorney, Agent, or Firm* — Alston & Bird LLP

(57) ABSTRACT

A pyramid structure to mitigate optical probing attacks in ICs by scrambling the measurements reflected by a laser pulse is disclosed. The pyramid structure is applied to selected areas at the bottom surface of the metal traces in metal layer to circumvent the extra silicon layer and thus minimize the changes to the conventional device structures. The pyramid structure includes randomized pyramids at nanometer scale. Optical simulation results show the pyramidized metal surface is able to prevent optical probing attacks. The fabrication of pyramids is CMOS compatible as well. Optical simulations are performed to analyze the impact these nano-scaled pyramids in a laser voltage probing attacking model. The nanopyramid can disturb the optical measurements enough to make the attacks practically infeasible. In addition, the nanopyramid structure countermeasure works in a passive mode without consuming any energy.

6 Claims, 7 Drawing Sheets

(51) Int. Cl.
*H01L 23/00* (2006.01)
*H01L 21/768* (2006.01)
*H01L 23/532* (2006.01)
*G01R 31/311* (2006.01)

(52) U.S. Cl.
CPC ............ *H01L 24/05* (2013.01); *G01R 31/311* (2013.01); *H01L 2924/14* (2013.01)

(56) References Cited

OTHER PUBLICATIONS

Garnett, Erik et al. *Light Trapping in Silicon Nanowire Solar Cells*, Nano letters, vol. 10, No. 3, Mar. 10, 2010, pp. 1082-1087. DOI: 10.1021/nl100161z.

* cited by examiner

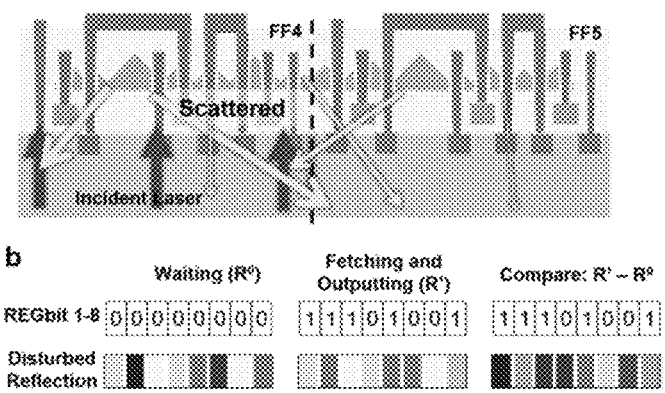
Fig. 3a
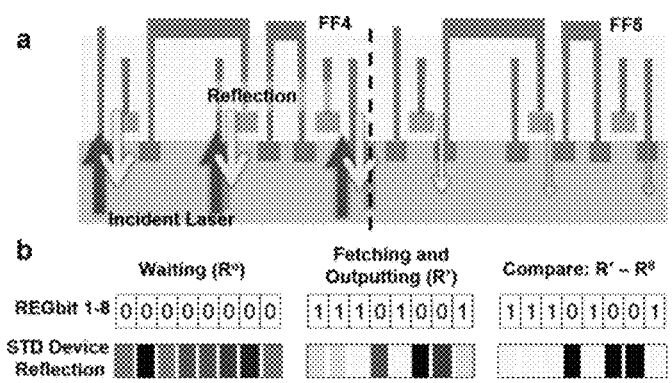
Fig. 3b
Fig. 3c

OPTICAL SCRAMBLER WITH NANO-PYRAMIDS

CROSS REFERENCE TO RELATED APPLICATIONS

This application claims the benefit of U.S. Provisional Patent Application No. 62/800,714, titled "NANOPYRAMID: AN OPTICAL SCRAMBLER AGAINST BACKSIDE PROBING ATTACKS" filed on Feb. 4, 2019, which is incorporated by reference herein in their entirety.

STATE OF GOVERNMENT SUPPORT

This invention was made with government support under grant number FA9550-14-1-0351 awarded by the U.S. Air Force Office of Scientific Research (AFOSR). The government has certain rights in the invention.

TECHNICAL FIELD

The present application relates to the technical field of integrated circuit (IC) security. Particularly, it is related to a protective nanostructure inside an IC to prevent optical attacks.

BACKGROUND

Over the past two decades, optical probing techniques have been developed for failure analysis of integrated circuits (ICs) with the photon emission microscopy (PEM) and later laser voltage probing (LVP). These techniques are based on the measurements of optical signals, and thus are considered as "contactless" probing. Although such techniques are greatly helpful for signal tracking and understanding the functionality of ICs for failure analysis and debug, they can also be used to perform attacks and cause serious security concerns. Reported studies have shown that PEM and LVP can read the information from memory cells, registers, and hardware security primitives such as physical un-cloneable functions (PUFs).

To perform such attacks, the adversaries firstly need to have knowledge about the layout of the device under test. At a minimum, transistors, memory cells and registers should be localized to an area of interest. They should also have access to the equipment needed to acquire clear optical images of the device, such as a photon emission microscope. Optical signals may then be collected from the device, usually when the device is working, analyzed, and used to extract the sensitive information such as cryptographic keys, proprietary firmware, or unencrypted bit streams. For example, in typical complementary metal-oxide-semiconductor (CMOS) devices, there is significant current only when the transistors are switching. The current transportation is fulfilled by the recombination of electrons and holes in transistors, which results in photoemission that directly indicates the switching of transistors. Since modern IC device feature sizes are below the wavelength of the light used by optical microscopes (from visible to infra-red), solid-immersion-lenses (SIL) have been used to improve the spatial resolution of imaging. Meanwhile, with smaller transistor channel size and decreasing supply voltage, inherent photon emission from each transistor and logic gate is significantly reduced, making the detection more difficult. Therefore, newer techniques such as LVP employ external laser sources to provide more photons for probing. Novel imaging techniques such as phase lock scanning in frequency domain have also been developed. There are other optical attacks like laser fault injection that do not necessarily require optical images of the circuits. Instead, changes in the IC output caused by the faults are analyzed to derive secret information.

Several countermeasures against the optical probing attacks have been proposed. For example, a protective optical layer was coated on the backside of dies, while light emitting diodes (LEDs) and photon detectors are fabricated on the front side. The protective layer reflects light from the LEDs and the reflection is monitored by the photon detectors. Any silicon thinning occurring on the backside that is necessary for optical attacks will damage the layer and change the reflection, which can be captured by the detector. This technique provides a general solution against the backside attacks but may require costly steps to integrate the LEDs and detectors into standard complementary metal-oxide-semiconductor (CMOS) circuits. In other research, ring-oscillator PUFs (RO-PUFs) were utilized as sensors to capture incident laser signals to trigger the alarm on attacks. In such designs, the RO-PUFs represent additional overhead and need to be placed close to the protected circuits. In addition, all the countermeasures mentioned above work in active mode. In other words, the sensors require additional power to detect the attack and self-destruct sensitive data upon detection.

BRIEF SUMMARY

Nanopyramid structures inserted into transistors to scramble the optical measurements during the attacks are disclosed. The nanopyramid-based security design works in completely passive mode without consuming any extra power.

A number of CMOS compatible techniques to fabricate these nanopyramid structures in a silicon process are also disclosed.

According to one embodiment of the disclosure, the device includes: a plurality of transistors formed on a substrate, a first dielectric film disposed on the transistors, a silicon film in crystalline form disposed on the first dielectric film, nanopyramid structures formed in the silicon film, the plurality of pyramid structures comprises randomly sized pyramids in nanometer scales, a second dielectric film disposed on the silicon film, and a plurality of interconnecting via structures formed through the first dielectric film, the silicon film, and the second dielectric film, before connecting to the plurality of transistors.

According to another embodiment of the disclosure, an integrated circuit scrambler against backside probing attack includes: a first dielectric film disposed on a substrate; a plurality of transistors formed in the first diacritic layer on the substrate, wherein each of the plurality of transistors comprises a gate, a source and a drain; a second dielectric film on the plurality of transistors; a plurality of pyramid structures formed on a top surface of the second dielectric film, wherein the plurality of pyramid structures comprises randomly sized pyramids in nanometer scales; a plurality of interconnecting via structures formed through the second dielectric film to connect to the plurality of transistors; a third dielectric film formed on the top surface of the second dielectric film, wherein the third dielectric film comprises patterned trenches configured to align to the plurality of interconnecting via structures in the second dielectric film; and a metal layer formed on the third dielectric film in a Damascene process, wherein the metal layer filled the trenches in the third dielectric film and the plurality of interconnecting via structures in the second dielectric film, wherein the metal layer is configured to be flat at a top by a polishing process.

Optionally, the metal layer includes copper.

According to another embodiment of the disclosure, a method of fabricating an integrated circuit scrambler against backside probing attacks includes the following steps: providing a silicon substrate with a plurality of transistors such as flip flops, disposing a first dielectric film on the transistors, depositing a silicon film in crystalline form in (100) plane on the first dielectric film; performing anisotropic etching on the silicon film to form a plurality of randomly sized nanopyramid structures having surfaces in silicon (111) plane, depositing a second dielectric film on the silicon film, patterning interconnecting vias through the stack of silicon film, the first and the second dielectric films; and filling the interconnecting vias with conductive materials to connect to the plurality of transistors.

According to another embodiment of the disclosure, a method of fabricating an integrated circuit scrambler against backside probing attacks includes: providing a substrate; deposing a first dielectric film on the substrate; forming a plurality of transistors in the first dielectric layer on the substrate, wherein each of the plurality of transistors comprises a gate, a source and a drain; deposing a second dielectric film on the plurality of transistors; forming a plurality of pyramid structures on a top surface of the second dielectric film, wherein the plurality of pyramid structures comprises randomly sized pyramids in nanometer scales; forming a plurality of interconnecting via structures through the second dielectric film to connect to the plurality of transistors; disposing a third dielectric film formed on the top surface of the second dielectric film, wherein the third dielectric film comprises patterned trenches configured to align to the plurality of interconnecting via structures in the second dielectric film; and disposing a metal layer on the third dielectric film in a Damascene process, wherein the metal layer filled the trenches in the third dielectric film and the plurality of interconnecting via structures, wherein the metal layer is configured to be flat at a top by a polishing process such as CMP.

According to another embodiment of the disclosure, a method of applying an integrated circuit scrambler in a scrambling process includes the steps of configuring a testing laser to send a laser light at a backside of the substrate under one of the plurality of transistors, and configuring a photodetector to receive a reflected laser light signal from the plurality of nanopyramid structures under another transistor from the backside of the substrate.

BRIEF DESCRIPTION OF DRAWINGS

FIG. 3a shows the schematic diagram of laser reflection in a nanopyramid device with upward pyramids, FIG. 3b shows another nanopyramid device with upside down pyramids, and FIG. 3c shows the bit value change from each flip-flop transistor revealed in a nanopyramid device.

DETAILED DESCRIPTION

Figure 1A:
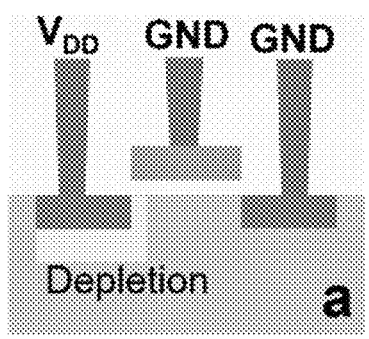
FIGS. 1a and 1b show cross sectional views when a transistor switches under different bias voltages.

It should be understood that the examples and embodiments described herein are for illustrative purposes only and that various modifications or changes in light thereof will be suggested to persons skilled in the art and are to be included within the spirit and purview of this application.

Such alterations, modifications, and improvements are intended to be part of this disclosure and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

In contrast to destructive reverse engineering, optical attacks typically require a working device to extract the desired secret information. Therefore, the entire circuit should be maintained functional. Optical signals in the attacks passing through semiconductors (i.e., transistors made from silicon in most cases) are affected by optical properties of various materials in the stack. The complex and dense metal structures on the front side of modern CMOS devices block light, therefore most optical attacks are performed from the backside of the IC devices. In this process, the backside of the IC is first exposed through partial decapsulation so that the light has access to and from the active regions of the dies. Then, the thick silicon substrate, at about a few hundreds of microns, must be thinned down to a few microns without destroying the diffusion well layers. At that thickness, infrared (IR) photons with wavelengths longer than 1000 nm in air can effectively pass through. Although recent technology nodes are entering the sub—10 nm range, which is way below the resolution of an optical microscope, typical optical attack targets such as memory cells or registers are comparably larger and thus can still be spatially resolved by the microscopes. Meanwhile, a microscope with SIL can be used to further improve the spatial resolution, making the visible-IR optical attacks still possible for 10 nm technology nodes.

Photon Emission Microscopy (PEM) has been a popular optical probing technique. The photon emission in IC devices mainly occurs when transistors are in saturation mode. In digital CMOS devices, transistors go into saturation mode only when they are switching. Hence the photon emission is directly related to the transistor switching operation which can leak sensitive information. Photon emission strongly depends on the bias voltage. However, modern CMOS devices operate at lower supply voltages, so the photon emission has been significantly reduced. With decreasing supply voltages, the photon emission is expected to be further reduced, making the PEM attacks more difficult on shrinking CMOS devices.

Laser Voltage Probing (LVP) has been applied in optical probing. In LVP, the carrier distribution in semiconductor materials impacts the optical properties of the materials. In CMOS devices, changes of the carrier distribution are controlled by the applied voltage which can thus be probed by monitoring for changes in optical images. Lasers have been used as probes to detect voltages applied on semiconductor devices for failure analysis. With LVP, the cells in the CMOS device can be imaged in time domain or in frequency domain. The LVP imaging in frequency domain is also called laser voltage imaging (LVI) to distinguish it from the traditional LVP imaging in the time domain.

Figure 1B:
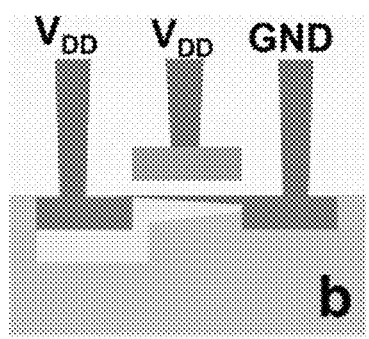

FIGS. 1a and 1b show cross sectional views when a transistor switches under different bias voltages. FIG. 1a shows a transistor having no bias voltage and FIG. 1b shows the carrier distribution changes with a bias voltage. By measuring the changes, the semiconductor device operating mode can be captured by PEM or LVP. As PEM attacks are more challenging on scaled-down CMOS devices, LVP has been applied more recently.

Figure 2A:
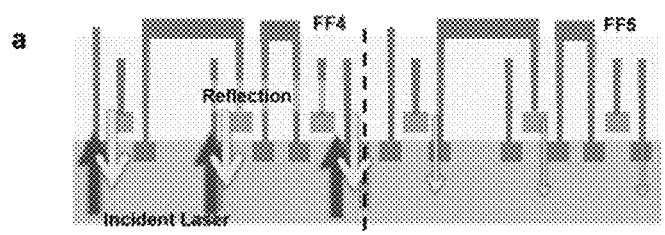
FIG. 2a shows the schematic diagram of laser reflection in a standard device and FIG. 2b shows the bit value change from each flip-flop transistor revealed in a standard device.

Typical targets of optical probing attacks are memory cells, registers, and physical un-cloneable functions that process sensitive data, e.g., secret keys. An LVP attack on an 8-bit register based on D-type flip-flops (FFs) is shown in FIGS. 2a and 2b as an example.

The register includes eight flip-flops, corresponding to Bit 1-Bit 8. To find out the value of Bit 1, the laser beam (typical spot size about 1 $\mu m^2$) is aimed directly on back of the first flop-flop (FF4), perpendicularly entering the device. The laser light is diffused and scattered while traveling in the device materials. Some of the light is absorbed, some transmitted, and the rest is reflected. As the detecting optical system cannot exclude the reflections from neighbor regions, all the reflected signals are collected from a region (i.e., the field of view of the microscope) wider than the target area. Assuming the outputs are "0000 0000", the intensities of the reflection signals collected in eight observations (i.e., laser beam parks on 8 spots, from FF1-FF8) are close to each other (generally dark in FIG. 2b, reflections from standard CMOS devices). However, only a small part of the light is scattered to/from the neighboring CMOS devices in the planar layers, thus the reflected signal is mainly conveying the status of FF4. FIG. 2a shows that reflection of the laser mainly depends on the status of the illuminated flip-flops (FF4), hardly affected by the neighbor ones (FF5) in a standard device.

Figure 2B:

FIG. 2b shows the bit value change from each flip-flop revealed in a standard device, which is observed by the reflection changes from (0000 0000) to (1110 1001) ($\Delta R(i)$), where each bit value corresponds to each flip-flop. When the 8-bit register is waiting for input (referred to this as "waiting period"), the voltage applied on all the bits (FF1-FF8) is the same. As the outputs are "0", the intensities of the reflection signals from FF1-FF8 are close to each other, shown as generally dark in FIG. 2b. When the register is fetching and outputting data (e.g., secret key), the voltage applied depends on the input and output value (referred to this as "outputting period"). The reflection of the flip-flops corresponding to "0" output does not change from the "waiting period", while the reflection of those corresponding to "1" output changes due to re-distributed carriers in silicon. Although variations may be present as depicted in FIG. 2b by different grayscales from process variations such as in materials properties (e.g., doping, geometry, etc.) and other background noise, differential reflection analysis (by calculating $\Delta R(i)=R'(i)-Ro(i)$) can effectively eliminate the variations and thus clean signals can be obtained. In FIG. 2b each bit value corresponds to each flip-flop revealed in a standard device.

In FIG. 2b, R(i) is defined as the reflection measured from the in-operation devices when the laser beam is located on the ith flip-flop key(FF i). The subscript "o" (i.e., Ro) represents signals during the "waiting period" and apostrophe (i.e., R') represents signals during the "outputting period". "STD" and "NP" represent standard CMOS devices and devices with nanopyramids respectively. For instance, $R'_{NP2}(4)$ is the reflection signal measured on nanopyramid device No. 2, when the laser is located on FF4 as the register is outputting the key. The difference of reflected signal between Ro (i) and R'(i) for a given key, e.g., (0010 1001), is written as $\Delta R$ 0010 1001(i).

Building nanopyramids is preferred on particular crystal facets because crystal materials present different chemical reaction activities on different facets. For example, the etching rate of crystal silicon in chemical etchants (wet etching), such as potassium hydroxide (KOH) and tetramethylammonium hydroxide (TMAH), is fast on (110) and (100) facets but very slow on (111) facets. Most silicon wafers for electronic devices have top surface set at (100) or (110), such anisotropic etching eventually ends with silicon (111) facets present on the surface, textured in pyramid structure. The morphology of the pyramids can be controlled by using a mask during etching. Dry etching such as reactive ion etching (RIE) can also be used on silicon to obtain anisotropic textured surfaces. Such pyramid texture structure can dramatically increase scattering of incident light; therefore, it has been widely used in solar cell fabrication for surface treatment to enhance the sun light harvesting.

As discussed above, a successful LVP attack on a register is based on a reliable measurement of the laser beam reflection relative to the register bit switching. The design goal for a security device is to scramble the measurements during an LVP attack. To realize this objective, randomly distributed silicon nanopyramids is inserted in the CMOS devices to interfere with the light absorption, scattering, and reflection as shown in FIG. 3a. In FIG. 3a, the nanopyramid device has upward pyramids. FIG. 3b shows another nanopyramid device with upside down pyramids. The upside down nanopyramids have an easier fabrication process, since the upside-down pyramid structures can be implemented on the bottom surface of a metal layer.

An incident laser is scattered around, leading to the reflection that includes the light from not only the illuminated flip-flop (FF4) but also the neighbor ones (FF5). In the 8-bit register, two effects can be expected due to the nanopyramids: 1) the reflections from FF1-FF8 now vary randomly to a switching device FF i, arise from neighbor ones FF j, where j is not equal to i. For example, in FIG. 3a incident laser is scattered around, leading to the reflection which includes the light from not only the illuminated flip-flop (FF4) but also the neighbor ones (FF5).

FIG. 3c reveals that the bit values getting scrambled in a nanopyramids layer, either with upward or with upside down pyramids, from the reflection changes so the bit values become difficult since the observation of reflection changes ($\Delta R(i)$) is scrambled.

To sufficiently diffuse the light reflection, the nanopyramids should be prepared as close to the transistor layer as possible. They can be placed above or below the transistors.

In the former case, pyramids could be inserted between transistor layer and first metal layer. One concern for such a structure is that the pyramid silicon layer may result in shorts among vias/contacts. To avoid shorts, the CMOS processing should be modified.

Figures 4A, 4B, 4C, 4D, 4E, 4F, 4G, 4H:
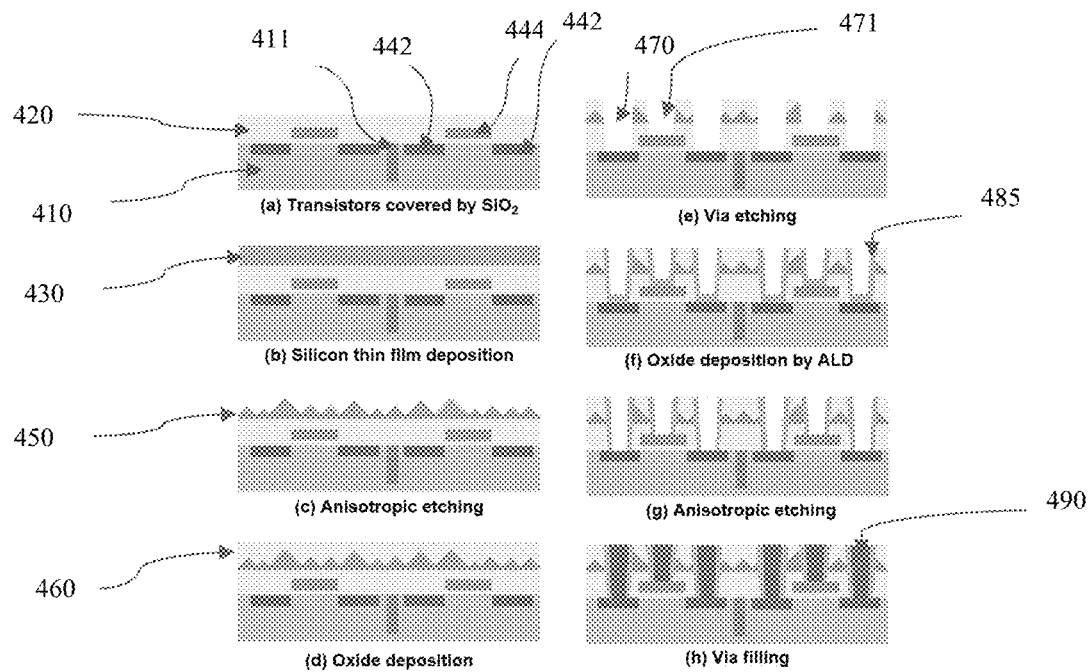
FIGS. 4a-4j show the device cross sections following the fabrication steps in a silicon substrate for a nanopyramid CMOS device, according to one embodiment of the current disclosure.

FIGS. 4a-4h show the device after modified fabrication steps in a silicon substrate 410 for a nanopyramid CMOS device, according to one embodiment of the current disclosure. FIG. 4a shows the device (gate 444 and source/drain 441/442) separated by isolation structures 411 after a step depositing a layer of SiO2 420 over the transistor layer. FIG. 4b has a silicon thin film 430 deposited over the SiO2 420 in FIG. 4a. FIG. 4c shows the silicon thin film 430 after the anisotropic etching to form the nanopyramid structures 450 in a protected area while the rest of areas (not shown) are covered by a mask to prevent the etching. FIG. 4d shows the top surface is deposited with oxide 460 followed by CMP polishing. FIG. 4e illustrates the device cross section after trench (via) 470 connecting to source/drain 441/442 and vias 471 connecting to gates are etched through the oxide films 420 and 460, including the nanopyramid structures 450 in the positions of the vias and trenches 470 and 471. In FIG. 4f a thin adhesion layer 485 is deposited to cover the sidewalls and the bottom surfaces of the trenches or vias. This step can be accomplished by atomic-layer-deposition (ALD), and the adhesion layer may include silicon oxide or silicon nitride, etc. FIG. 4g shows that the adhesion layer at the trench or via bottom surface is exposed by applying anisotropic etching to allow good electrical connection in the subsequent via filling. FIG. 4h illustrates the cross section of the completed nanopyramid structure over transistors after filling the trenches or vias with conductive materials 490. Compared to a standard CMOS processing, the modified process has the sidewall surfaces of the vias between the transistor layer and the first metal layer which is coated with insulating materials to prevent shorts between vias caused by the nanopyramids (referring to FIG. 4f).

To fabricate the pyramids, a crystalline silicon thin film in (100) plane is prepared for the pyramids. Then the inclination facets after etching are in (111) plane. The angle between the bottom and the facets is about 54°. The sizes of the pyramids are controlled to be in the range of 10-400 nm. Because of the angle between the crystals' facets are constant, the heights of the pyramids depend on their sizes. Thus, the sizes and the locations of the pyramids are generated randomly, following a normal distribution. The settings here can be modified for silicon thin films prepared under different conditions. The silicon thin film grown by common techniques such as low pressure chemical vapor depositions (LPCVD) is typically polycrystalline rather than mono crystalline. After etching, the orientations of the pyramids will vary. The sizes and the distributions of the pyramids can be controlled by a surface mask during etching. The pyramids' heights can also be controlled by the process of chemical mechanical planarization (CMP).

Pyramidized Metal Surface as Passive Countermeasure Against Optical Probing Attacks To fabricate the device in FIG. 3b, a lightly different process than the above can be implemented on the bottom surface of layer 495 metal 1 (M1).

Figures 4I, 4J:
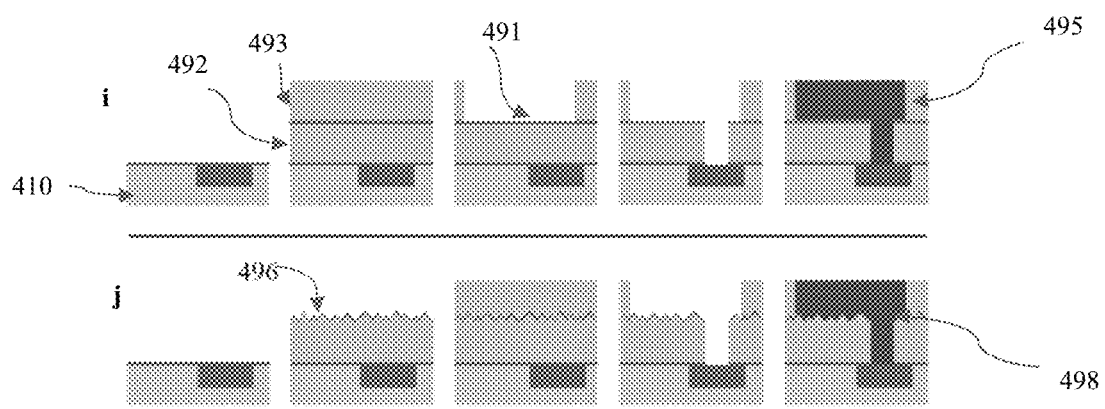

To fabricate the metal, a Damascene process is usually used for modern IC devices, as briefly shown in FIG. 4i. First, the silicon wafer 460 is selectively doped as designed and covered by a thin film hard mask 491 serving as dielectric etching stopper. Secondly, two dielectric layers, one 492 for contacts or vias and one 493 for M1, are coated with another dielectric etching stopper between them. Thirdly, lithography and dielectric etching are performed to prepare the trench. The etching will self-terminated on the etching stopper 491. Fourthly, lithography is performed again, followed by stopper etching and dielectric etching, subsequently. Then trench etching is performed for contacts/vias to prepare for M1 495 deposition. The trench for contacts or vias is ready by this moment. Finally, the metal is deposited into the trench. After the chemical-mechanical-planarization (CMP) process, the M1 forming is complete and the device is ready for the fabrication of higher layers. The bottom surface of M1 is actually controlled by the top surface morphology of the first dielectric layer. Therefore, to have pyramidized the metal surface 498, it is necessary to implement the pyramid structure on dielectric layer 496 beforehand, as shown in FIG. 4j. The method offering a better control might be to fabricate a layer of silicon nanopyramids and fully oxidize the silicon nanopyramid layer by annealing in a furnace. The stopper layer and the following processes can then be coated in the same way to those for the fabrication in FIG. 4a-4h.

Figure 5:
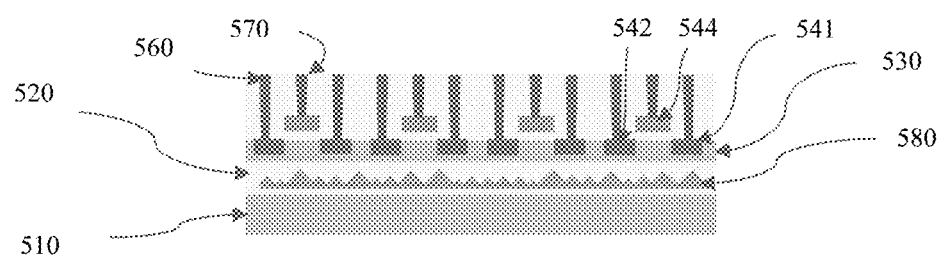
FIG. 5 shows a cross sectional view of a nanopyramid CMOS device in a SOI substrate, according to another embodiment of the current disclosure.

FIG. 5 shows a cross sectional view of a nanopyramid CMOS device in a SOI substrate, according to another embodiment of the current disclosure. A SOI substrate 510 has an embedded oxide under the top silicon surface. Nanopyramids 580 are fabricated in the top silicon surface. A dielectric layer 520 is deposited to cover the nanopyramids 580. A surface polishing process is performed to flatten the top surface of the dielectric 520. A silicon wafer with transistors isolated in a dielectric layer 530 is provided. The transistors have gates 544, sources/drains 541/542. Then silicon-on-insulator (SOI) substrate 510 is bonded with the silicon wafer, with the transistors facing the nanopyramids 580. The nanopyramids 580 are incorporated in the dielectric layer 520 under the transistors before the bonding of surface crystal silicon layer, without any concerns of shorts. For simplicity, an exemplary structure is used to describe the functions.

As the nanopyramid structure is placed either above or beneath the active register-transistor-layer (RTL), or these nanopyramids are fabricated to be upward or upside down, the structure and the performance of the transistors are little impacted. In other words, the nanopyramid structure can be applied on the more advanced Fin-FET structure as well.

To evaluate the influence of nanopyramids, simulations based on 16 nm metal gate CMOS devices are performed. An 8-bit secret key is fetched by a flip-flop based 8-bit register in parallel mode and the register is the target under LVP attack.

To simulate the attack, an 8-bit register is used based on D flip-flop for the secret key fetching and outputting. In each D flip-flop, the regions where charge carrier distribution changes during the 0→1 switching are counted according to the layout. The corresponding carrier concentration changes are calculated based on the drain/source/well doping densities and the applied voltage from PTM 32 nm HP Model Card. A compact D type flip-flop layout design is used for a case study. The area of each flip-flop is about 6 μm. Most spare area in M1 is filled with metallic fillers.

As an exemplary case, the device in attack simulation is an 8-bit register based on D flip-flop for the secret key fetching and the outputting. In each D flip-flop, the regions where charge carrier distribution changed during any 0→1 switching are counted according to the original circuit layout. The carrier concentration changes are calculated based on the drain/source/well doping densities and the applied voltages. A compact D type flip-flop layout design is used for the simulation example. The area of each flip-flop is about 6 µm.

Figure 6:
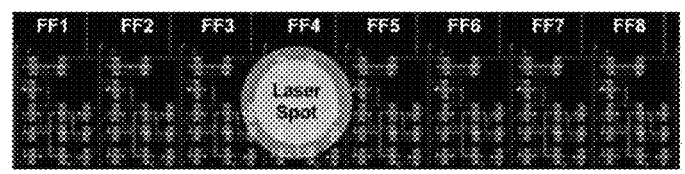
FIG. 6 shows a laser beam spot located on the 4th flip-flop of an 8-bit register, as an exemplary case, according to the current disclosure.

FIG. 6 illustrates a laser beam spot is located on the 4th flip-flop (FF4) to read the bit information of the 8-bit register. The attacker will scan the laser beam from FF1 to FF8. When the laser beam is located on FF4 for instance, the attacker observes the reflection by an optical microscope system. Once a change higher than a preset critical value is observed, the attacker assumes the change is caused by a switching (0→1 transition) that has occurred on the corresponding FF4, which indicates the 4th bit of the key is 1. By repeating this procedure on all the register bits, all bits of the secret key are eventually guessed. The simulation is based on 2D Drude-Lorentz dispersion model by finite element methods.

Optical parameters: the wavelength of the laser can be infra-red, visible, or ultraviolet. For the exemplary simulation, it is set as 1.064 µm, a commonly used laser source for LVP attacks. Once the carrier distribution in the register is determined, refractive index (n) and extinction coefficient (k) of materials at selected wavelength are used for the calculation. Change of free carrier density in insulating materials (e.g., silicon oxide and high k materials) and metals (e.g., tungsten and copper) are negligible, only changes of n and k in silicon during the flip-flop switching are considered. The changes of n and k in silicon can be described by:

$$\Delta n = \frac{e^2 \lambda^2}{8\pi^2 c^2 \varepsilon_0 n} \left( \frac{\Delta N_e}{m_{ce}^*} + \frac{\Delta N_h}{m_{ch}^*} \right) \quad (1)$$

$$\Delta \alpha = \frac{\omega}{c} \Delta k = \frac{e^2 \lambda^2}{8\pi^2 c^2 \varepsilon_0 n} \left( \frac{\Delta N_e}{m_{ce}^{*2}} \mu_e + \frac{\Delta N_h}{m_{ch}^{*2}} \mu_h \right) \quad (2)$$

where e is the elementary charge, $\lambda$ is the light wavelength in air, c is the light speed in air, $\varepsilon_0$ is the vacuum permittivity, $\Delta Ne$ is the change of electron carrier concentration, $\Delta Nh$ is the change of hole carrier concentration, $m^*_{ce}$ is the effective mass of one electron carrier, $m^*_{ch}$ is the effective mass of one hole carrier, $\mu_{ce}$ is the mobility of one electron carrier, $\mu_{ch}$ is the mobility of one hole carrier, and $\omega$ is the angular frequency of the light.

Figure 7A:
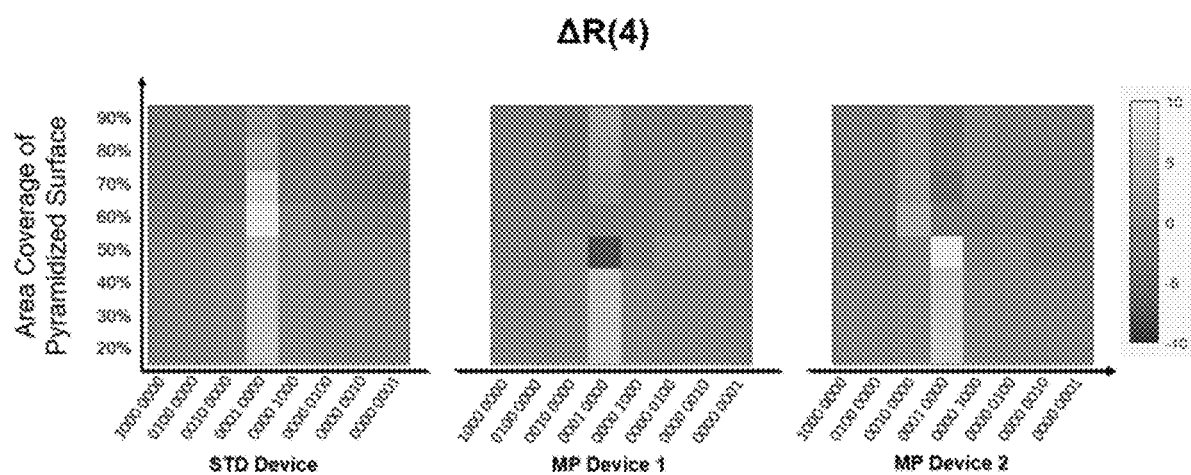
FIG. 7a and FIG. 7b illustrate the optical simulation results of laser reflection obtained on a standard and a few pyramidized devices respectively.

FIG. 7a illustrates the optical simulation results of laser reflection from obtained on a standard and two pyramidized devices respectively.

Figure 7B:
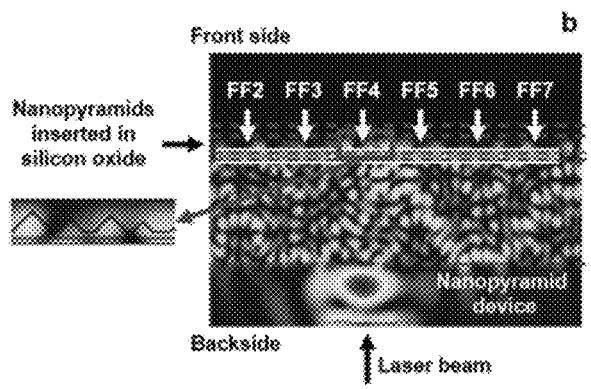

FIG. 7b shows the optical simulation of the laser reflection from a nanopyramid device, according to the current disclosure. The simulation is performed on both standard devices and nanopyramid devices first when the register is not fetching the key from memory, and when the outputting of all the flip-flops is 0. Partial cross-sections of the standard register and the nanopyramid register are calculated, with laser beam located on FF4 of each one. For consistency, the laser beam on FF4 is referred as the example. The grey scale corresponds to normalized light intensity from 1 to 0. From the standard device in FIG. 7a, given the normally incident laser beam, the light path is quite regular and symmetric. The light is confined over a relatively small region. Only a small portion of the light spread to neighboring flip-flops (e.g., FF2, FF3, FF5, etc.). While on the nanopyramid device in FIG. 7b, the light scattering is dramatically increased. Instead of symmetric distribution, the light intensity distribution is highly disordered, attributed to the randomly distributed and sized nanopyramids. It is clear on the simulation results that a considerable amount of the incident light is scattered in the device and reaches cells far away. Simulation in larger scale further demonstrates the pyramids scattering into cells that are several tens of microns.

Figure 8:
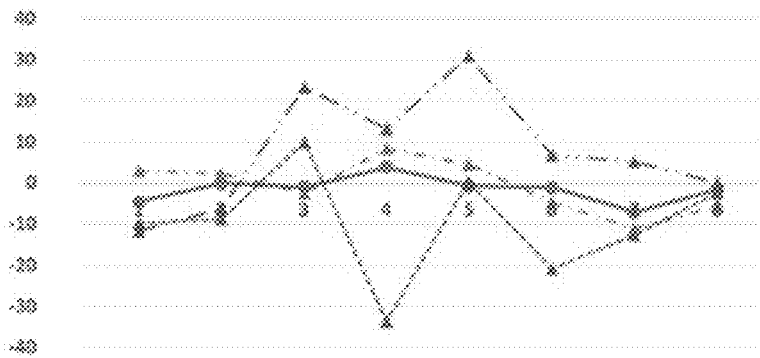
FIG. 8 shows simulated result of reflection differences $\Delta R_{STD}(4)$ from individual switching of FF1-FF8 on one stand and three pyramidized devices, according to the current disclosure.

FIG. 8 shows simulated result of reflection differences $\Delta R$ from individual switching of FF1-FF8 on one stand and three pyramidized devices, according to the current disclosure.

In the 2D simulation, the metal traces covering the whole silicon area is applied so a continuous metal trace in 3D is formed. It is assumed the laser beam is parked on FF4, while the key value changes from (1000 0000), (0100 0000), (0010 0000), . . . to (0000 0001). The FF1 is first biased for bit value 1, then FF2, FF3, to FF8 are biased for bit value 1, just every time there is only one flip-flop biased as bit value 1. A successful data extraction based optical probing should show valid $\Delta R$ only when the key value is (0001 0000) (i.e., FF4 is biased as 1), as the observation is made on FF4. When the biased flip-flop is not FF4, any valid $\Delta R$ is false positive. The optical simulation is firstly performed on standard device (STD) and then three pyramidized devices (MP1, MP2 and MP3 Devices), with FF1-8 biased one by one. $\Delta R(4)$ obtained from the simulation is plotted in FIG. 8.

In FIG. 8, simulated reflection difference $\Delta R$ from the individual switching of FF1-FF8 on one standard device (STD) and three pyramidized devices (MP1-MP3). The y-axis presents the relative reflection intensity difference (compared with R00000000) in arbitrary unit. Based on the STD device simulation, data is represented by the round dots on a solid curve, only biased FF4 gives a significant positive $\Delta R\Sigma T\Delta$, correctly indicating the Key of (0001 0000). When any other flip-flops biased, $\Delta R\Sigma T\Delta$, is insignificant or negative. While on the pyramidized devices (MP1-MP3), whose data are represented by triangles on three dashed lines, the variation of $\Delta R_{MT1}$ is much larger and a significant positive $\Delta R_{MT1}$ cannot lead to a correct guess of the status of FF4, any longer. For example, on Device MP1, still following the regulation obtained from the STD device, judging based on the observed $\Delta R_{MT1}$, the adversary will make a conclusion of "FF4 is biased" when in fact FF3 is biased (when $\Delta R_{MT1} > 0$). From device to device (e.g., MP 1, MP 2, and MP 3), the reflection behavior also varies due to the random morphology of the pyramidized metal surface. Therefore, it is not feasible to investigate the reflection behavior on one pyramidized sample and apply the observed regulation on another one.

Considering that the area of active metal traces in M1 varies with different devices and circuit designs, it is possible that the metal traces in M1 only covers a small portion of the total silicon area. From FIG. 4b, the total metal trace area equals the sum of via area and pyramidized surface area. Hence the pyramidized surface area is further reduced, which may decrease the light scattering and thus failed to scramble the optical probing. To investigate the effect of M1 area coverage, we change the M1 area coverage from 20% to 90% and repeat the simulation in the same way of the simulation performed before, on one standard and multiple pyramidized devices. The calculated $\Delta R$ is shown in FIG. 8.

The discontinuous x-axis represents the key values on each device (i.e., which flip-flop is biased as 1, and the depth represents the $\Delta R$ values in arbitrary unit. Again, for a successful probing attack, the adversary expects positive $\Delta R$ when and only when FF4 is bias as 1. In FIG. 8 that the assertion is valid on the standard device (STD) regardless of the pyramidized surface coverage varying. While on pyramidized devices, when the pyramidized surface coverage is higher than 50%, the value of $\Delta R$ varies from case to case, making it is difficult to make a correct guess on the status of FF4. For example, when the coverage is 70%, the biased FF4 on MP1 gives the positive $\Delta R_{MT1}$ which leads to a true positive conclusion. However, with the same operation, both biased FF3 and biased FF5 will give positive $\Delta R_{MT2}$, while biased FF4 gives a negative $\Delta R_{MT2}$, which leads to incorrect data extractions. As the pyramidization is random, the adversary has no clue about on which pyramidized device the positive $\Delta R$ correctly indicates the biased FF4, the chance to extract the correct key (usually of multiple bits, e.g., 64-bit) is extremely low. But if the pyramidized surface coverage is below 50%, as shown in FIG. 8, significant positive $\Delta R$ is always strongly related with a biased FF4, no matter if the device is a standard one or a pyramidized one, indicating limited optical scrambling. It is possible that if increasing the sample size to run more simulation, a rare case occurs that even with low pyramidized surface coverage the optical probing can still be scrambled. However, for the purpose of security assurance, higher than 50% coverage is recommended. To achieve this, metal fillers can be easily added into metal layers if the active metal traces in M1 do not cover enough area.

When the register is fetching the 8-bit secret key from memory, the standard flip-flop switches according to the bit values of the key. As the laser beam is moved from the first bit in the register to the last one. When the laser beam is located on one FF i (i is 1-8), every flip-flop is switched one by one to demonstrate the "individual switching impacts" on the reflection. The switching, as discussed above, leads to optical property changes and results in reflection changes. By calculating $\Delta R(4)$ when only FF1 is 1 (i.e., given key as 0000 0001 in binary or 1 in decimal), the individual switching of FF1 will affect the reflection which can be detected. Such calculation and comparison are carried out for all the flip-flops.

Pyramid shape study: the stopper coating is assumed thin enough thus it comforts to the prepared pyramidized dielectric surface, so the bottom surface of M1 also follows the shape of the dielectric surface. As described, the dielectric surface is from the silicon thin film. The silicon film for the pyramids is crystalline (100) plane. Then the inclination facets after etching are (111) planes. The angle between the bottom and the facets is about 54 degrees. The size of the pyramids is controlled in the range of 10-400 nm. Because the angle between crystal planes is constant, the heights of the pyramids depend on their sizes. Therefore, the size and location of the pyramids are generated randomly, following a normal distribution. The settings here can be modified for silicon thin films prepared under different conditions.

FIG. 8 shows simulated result of $\Delta R$ from individual switching of FF1-FF8 in a standard device and three pyramidized devices, according to the current disclosure.

Referring to FIG. 8, as illustrated, when the laser beam is located on FF4, only the switching of FF4 causes a considerable change in reflection, while the reflection change from the switching of other flip-flops is much less. A criteria (Cr.) can thus be easily set (e.g., $\Delta R_{STD}(4) > 2 \times 10^4 V^2/m^2$) for key bit (KB) guessing: if a reflection change is observed to be larger than $2 \times 10^4 V^2/m^2$ with laser beam on FF4, the 4th bit of the key (KB4) is 1. Otherwise KB4 is 0. According to simulations performed with laser beam located on other flip-flops (FF2-FF8), similar observation results are obtained.

Keeping the laser beam on FF4, $\Delta R_{STD}(i)$ is calculated for every possible key value (i.e., 0-127) and the results are plotted in FIG. 8a. The red data points represent those with KB4 of "1", while the blue data represent those with KB4 of "0". For switching on standard devices, all the solid lined spots come with significantly higher $\Delta R_{STD}(4)$ than all the dashed ones, indicating when the laser beam is on FF4, as long as the KB4 is "1", while increased reflection can be observed, regardless of the values of other key bits. Very similar results are obtained from cases with the laser beam located on other flip-flops. A clear and constant criterion ($\Delta R_{STD}(i) > 2 \times 10^4 V^2/m^2$) is thus found to be used for guessing all the bit values with high confidence, indicating the feasibility of efficient LVP attacks on the standard register.

On the contrary, for devices with the nanopyramid layer inserted, reflections from flip flops are blurred. When the nanopyramid layer is inserted in the device, the light reflection significantly depends on the geometry and distribution of the pyramids. To study the reflection behavior, the reflection changes along with the flip-flops switching for 100 devices impacted by the nanopyramid layer are randomly generated and calculated.

However, FIG. 8 also shows that the switching of FF5 or FF8 also increases the reflection, the attacker is mislead. This is just for one bit (KB4) out of an 8-bit key. The differential reflections ($\Delta R_{NP1}(4)$) for every possible key value with laser beam on FF4 are also plotted in FIG. 8. As seen, it is impossible to set a single criterion that separates the data points at KB4 as "1" or as "0" for all simulated devices.

As described above, during the observation, light reflection is collected from a region much larger than the whole register. The influence of neighboring flip-flops is incorporated into the reflection measurement. This is contrary to the standard device in FIG. 8, when the testing laser is located on one flip-flop (e.g., FF4), only a small part of the incident light is dispersed to neighboring flip-flops and reflected. Although the light reflected from the neighboring ones carries the neighbor flip-flops' switching information, its weight in total reflection signal is too low to disturb the interpretation of the illuminated flip-flop (FF4).

On nanopyramid devices, unlike in the standard device, a considerable amount of incident light is dispersed to neighboring flip-flops in the nanopyramid device. As there is much more light dispersed to the neighbors, the weight of one neighboring flip-flop's influence can be much higher during the interpretation compared to that of the standard device. If the weight is so high that it is comparable to the weight of the illuminated one (FF4), the reflection changes in the observation from the neighboring flip-flop switching scattered light interferes with the interpretation of FF4. Following the standard LVP attacking strategy, the attacker might assume that any observed increased reflection with the testing laser beam located on FF4 means the KB4 is 1 and FF4 switched.

In a few cases, the switching of the illuminated flip-flop (e.g., FF4) still dominates the reflection change $\Delta R$, as shown in 9d (right). In the example of Nanopyramid 4 (NP4), the negative $\Delta R_{NP4}(4)$ from FF4 makes it possible to discriminate the keys with Bit 4 (KB4) of "1" from KB4 of "0", by setting the criteria as $\Delta R_{NP4}(4) < -1 \times 10^5 V^2/m^2$.

Security analysis for the nanopyramid devices is disclosed below. In above discussion, key fetching which is usually realized by registers is the typical target of LVP attacks. Since the registers disclosed here are for secret key fetching, it is reasonable to assume that the attacker does not have direct access to feed the register with different inputs in order to study the reflection behavior prior to attacks. With that assumption, when the register fetches the secret key value in a parallel way (e.g., 8-bit register to fetch an 8-bit key), the attacker is able to obtain only two reflection measurement results from one flip-flop switching: one is during the "waiting" ($R^o$ (i)) and the other is during the key outputting (R'(i)). During the attack, the attacker first assumes that the illuminated flip-flop (FF i) switching always causes significant ΔR(i) while the other flip-flops (FF j, where j≠i) switching has insignificant influences on the reflection ΔR(i). This means that a significant ΔR(i) has to be from the switching of the illuminated flip-flop (FF i), but not from switching of the neighboring flip-flops (FF j, where j≠i). This is the fundamental assumption of the LVP attack. Based on this assumption, a criterion (Cr) set up is further required to evaluate the significance: if the ΔR(i)>Cr (when Cr>0) or ΔR(i)<Cr (when Cr<0), the flip-flop is switched and the correspond Key Bit is "1". Otherwise, the Key Bit is "0".

On the standard devices, the criterion $Cr_{std}$ that is valid and applicable for all flip-flops is easy to be found as reflection behaviors of all devices are very similar. To attack a standard register, the attacker measures the $ΔR'_{STD}(i)$ and $R'_{STD}$, calculates $ΔR_{STD}(i)(=ΔR_{STD}$ (i)–$R'_{STD}(i))$, tests $ΔR_{STD}(i)$ with the $Cr_{STD}$, and decides if the key bit of FF i or KBi is "0" or "1". However, when the attack is performed on nanopyramid registers, two factors—the large variation of $ΔR_{NP}(i)$ and the possible significant contributions $ΔR_{NP}$ (j) from neighbor flip-flops (FF j, where j≠i) will make the attack extremely difficult.

On nanopyramid devices, the simulation results show that the $ΔR_{NP}(i)$ varies from device to device. It can vary from negative to positive, in a much wider range compared to that on the standard devices FIG. 8. Such an enhanced variation of $ΔR_{NP}(i)$ makes the choice of $Cr_{NP}$ difficult. The bigger problem for the attacker is the significant $ΔR_{NP}(i)$ from neighbor flip-flops FF j (j≠i), which invalidates the fundamental assumption of the LVP attack: the significant $ΔR_{NP}(i)$ does not necessarily mean the switching of the illuminated flip-flop (FF i) any longer, as described in Section IV-B.

When a secret key, e.g., 0101001 (41 in decimal), is given on STD, NP1 and NP4 devices, $ΔR_{STD}(4) \sim 4.2 \times 10^4$, $ΔR_{NP1}(4) \sim 6.5 \times 10^4$, and $ΔR_{NP4}(4) \sim 2.5 \times 10^5$ are observed on the STD, NP1 and NP4 devices, respectively (FIGS. 8a-b and 9a-d). Using the fixed criteria "$ΔR_{STD}(i) > 2 \times 10^4 V^2/m^2$" for the STD one, the attacker can tell with confidence the KB4 is "1" (FF4 switched). However, the clues to guess the KB4 on NP1 and NP4 are lacking. The attacker can still try to use $Cr_{STD}$ obtained from the standard device to guess on nanopyramid devices, but these guesses do not help for the correct results for all devices.

If the key bit length is longer, such as 128 bit, and/or there are multiple keys, using one 8-bit register for fetching of key(s) will process the data in patches sequentially. This allows the attacker to observe the device reflection behavior with different outputs. Given enough observations, the attacker is able to estimate the distribution of the $ΔR_{NP}(i)$ and figure out a more reasonable $Cr_{NP}$ (e.g., the average value of $ΔR_{NP}(i)$). For instance, on both of NP1 and NP4, 16 keys (0010 1000-0011 1000, i.e., 40-56) are fetched and output by the 8-bit register sequentially. $ΔR_{NP1}(4)$ varying from $2.5 \times 10^5$ to $0.6 \times 10^5$ and $ΔR_{NP4}(4)$ varying from $3.4 \times 10^5$ to $0.9 \times 10^5$ are observed. Based on the observation, $Cr_{NP1}$ and $Cr_{NP4}$ are set as $<0.95 \times 10^5$ and $<1.25 \times 10^5$, respectively, by averaging observed $ΔR_{NP}(4)$. For NP4, as the ΔR(4) is significant only when FF4 switches, the $Cr_{NP}4$ (4) defined in this way allows the guessing of KB4 being correct with a high chance (~1). While on NP1, as the fundamental assumption is not valid, the $Cr_{NP1}(4)$ being 0.5 does not efficiently improve the probability of guessing KB4 correctly from random guessing.

To statistically evaluate the probability of guessing based on allowed observations, simulations of 100 nanopyramid devices (8-bit registers) are performed. On each device, $ΔR_{NP}(4)$ based on random key values (RKs), with the numbers of different keys being 0, 4, 16, 64, and 128 is observed. For "0" observation, $Cr_{STD}$ from standard device is used, otherwise $Cr_{NP}$ from nanopyramids is set as the mean value of all observed $ΔR_{NP}$. According to the assumption that the attacker does not have the direct electrical access to the register, the observation results ($ΔR_{NP}$) is obtained without knowing the value of input random keys for the register under attack. Once Cr is established, another target key (TK) is observed that the attacker wants to reveal and test if the value of KB4 can be correctly revealed based on the corresponding $ΔR_{NP}^{TK}$.

Figure 9:
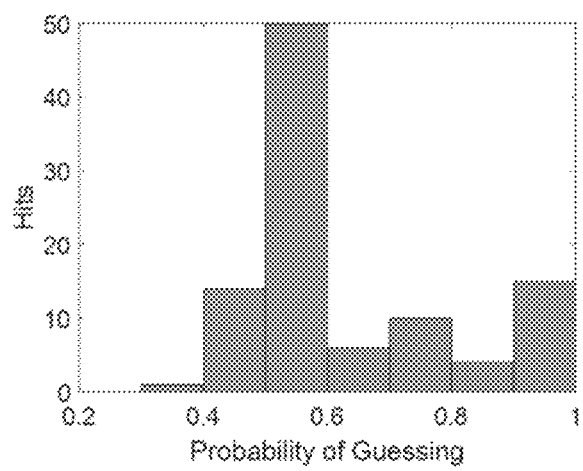
FIG. 9 shows the histogram of the simulated probability of guessing the key bits KB4 of random 8-bit keys from a complete reference based on observations on 100 nanopyramid devices, according to the current disclosure.

The histogram of the simulated probabilities of guessing KB4 resulting from the devices based on complete 128 observations is plotted in FIG. 9. Although about 20% devices allow a high confident guessing, the majority devices (>60%) give a guessing rate around 0.5. Although more observations improve the probability of guessing, the improvement is very limited (from 0.6209 of "0" to 0.6695 of "128"). Similar results are obtained from other flip-flops, given the chance to get the correct 8-bit key only about 0.04 even with 128 observations obtainable. It is worth noting that for the attacker, the observations of $ΔR_{NP}^{TK}(i)$ (i is 1-8) only gives one predicted 8-bit key. If the predicted key turns out to be wrong, the attacker needs to make another guess, which is not based on the observation results anymore. The probability of 0.04 listed does not mean the 8-bit key can be expected to be revealed after 25 rounds of guess and test. In addition, the probability of guessing can be further diminished easily in practical circuits, by using registers with longer bits and/or limiting the number of different keys fetched by one register. FIG. 9 shows the histogram. The results obtained from a standard register is summarized in Table I.

TABLE I

| | Probability of guessing based on different allowed reference observations | | | | |
|---|---|---|---|---|---|
| Obs. | 0 (STD) | 4 | 16 | 64 | 128 |
| 1 bit | 0.6209 | 0.6294 | 0.6425 | 0.6588 | 0.6605 |
| 8 bit | 0.0221 | 0.0246 | 0.0290 | 0.0355 | 0.0404 |

In summary, Si nanopyramids structure is disclosed as a scrambler to protect the critical information in ICs. It interferes the optical measurement during the backside optical probing attacks. To achieve this goal, the nanopyramids are inserted between the transistor layer and metal layer 1. If the device is fabricated on bonding-based SOI wafer, the nanopyramids can be placed in the isolating layer beneath the transistors instead. The fabrication is compatible to CMOS processing with several inexpensive steps and no extra mask is required. The optical simulation results from the standard device and the nanopyramid devices demonstrate that the reflection behavior of the devices is changed due to the enhanced scattering arise from the pyramids. Because of the randomness of the nanopyramids, in terms of size and dislocation, the optical reflection collected the nanopyramid devices is not reliable to be used to reveal the corresponding circuit (e.g., flip-flops) status. As a result, an efficient LVP attack can be prevented.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. An integrated circuit scrambler against backside probing attacks, comprising:
   a substrate;
   a first dielectric film disposed on the substrate;
   a plurality of transistors formed in the first dielectric film disposed on the substrate, wherein each of the plurality of transistors comprises a gate, a source and a drain;
   a second dielectric film disposed on the plurality of transistors;
   a first plurality of pyramid structures formed on a top surface of the second dielectric film, wherein the first plurality of pyramid structures comprises randomly sized pyramids in nanometer scales and wherein the first plurality of pyramid structures is oriented in a vertical direction;
   a plurality of interconnecting via structures formed through the second dielectric film to connect to the plurality of transistors;
   a third dielectric film disposed on the top surface of the second dielectric film, wherein the third dielectric film comprises patterned trenches configured to align to the plurality of interconnecting via structures in the second dielectric film; and
   a metal layer disposed on the third dielectric film in a Damascene process, wherein the metal layer fills the trenches in the third dielectric film and the plurality of interconnecting via structures in the second dielectric film, wherein the metal layer is configured to be flat at a top by a polishing process, wherein a second plurality of pyramid structures formed on a bottom surface of the metal layer.

2. The integrated circuit scrambler against backside probing attacks of claim 1, wherein the metal layer comprises copper.

3. The integrated circuit scrambler against backside probing attacks as claim 1, wherein the first plurality of pyramid structures is formed in a silicon plane.

4. The integrated circuit scrambler against backside probing attacks as claim 1, wherein the first, second and third dielectric films each comprises silicon dioxide.

5. The integrated circuit scrambler against backside probing attacks as claim 1, wherein the plurality of transistors functions as flip-flops or bits of registers.

6. The integrated circuit scrambler against backside probing attacks as claim 1, wherein in a scrambling process, a testing laser is configured to send a laser light at a backside of the substrate under one of the plurality of transistors, and a photodetector is configured to receive a reflected laser light signal from the first plurality of pyramid structures and/or the second plurality of pyramid structures under another transistor from the backside of the substrate.

* * * * *